United States Patent
Chani et al.

(10) Patent No.: US 10,994,387 B1
(45) Date of Patent: May 4, 2021

(54) FABRICATION OF FLEXIBLE CONDUCTIVE FILMS, WITH SEMICONDUCTIVE MATERIAL, FORMED WITH RUBBING-IN TECHNOLOGY FOR ELASTIC OR DEFORMABLE DEVICES

(71) Applicant: King Abdulaziz University, Jeddah (SA)

(72) Inventors: Muhammad Tariq Saeed Chani, Jeddah (SA); Abdullah Mohamed Asiri, Jeddah (SA); Hasan Karimov, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 17/015,811

(22) Filed: Sep. 9, 2020

(51) Int. Cl.
| | |
|---|---|
| *B29C 71/00* | (2006.01) |
| *B24B 7/30* | (2006.01) |
| *H01L 23/498* | (2006.01) |
| *B32B 25/04* | (2006.01) |
| *B32B 27/08* | (2006.01) |
| *B29C 70/88* | (2006.01) |

(52) U.S. Cl.
CPC .............. *B24B 7/30* (2013.01); *B29C 70/882* (2013.01); *B32B 25/04* (2013.01); *B32B 27/08* (2013.01); *H01L 23/4985* (2013.01)

(58) Field of Classification Search
CPC ... B05D 1/12; B05D 5/12; B05D 3/12; H01B 5/14; D06M 15/70; B29C 2071/0018; B29C 70/882; Y10S 29/062; C23C 24/02
USPC .................. 427/11, 96.9, 201, 199
See application file for complete search history.

(56) References Cited

U.S. PATENT DOCUMENTS

| | | | | |
|---|---|---|---|---|
| 4,202,915 | A * | 5/1980 | Clayton | C23C 24/04 118/244 |
| 4,987,000 | A * | 1/1991 | Koshiba | C23C 26/00 427/11 |
| 5,650,193 | A * | 7/1997 | Swain | B05C 1/0813 118/107 |
| 5,672,380 | A * | 9/1997 | Uchida | B05C 19/04 427/180 |
| 6,025,014 | A * | 2/2000 | Stango | B05C 9/02 427/11 |
| 8,691,324 | B2 * | 4/2014 | Wu | C09C 1/46 427/11 |
| 9,631,989 | B1 * | 4/2017 | Asiri | H01C 17/06586 |
| 2003/0092207 | A1 | 5/2003 | Yaniv et al. | |

(Continued)

OTHER PUBLICATIONS

Tadakaluru et al., "Stretchable and Flexible High-Strain Sensors Made Using Carbon Nanotubes and Graphite Films on Natural Rubber", Sensors 2014, 14, 868-876.

(Continued)

*Primary Examiner* — Matthew J Daniels
(74) *Attorney, Agent, or Firm* — W&C IP

(57) ABSTRACT

Rubber composites with regions doped with conductive material, e.g., carbon nanotubes, and patterned regions doped with both conductive material and semiconductive material, e.g., carbon nanotubes and polcrystalline silicon are created with rubbing-in technology. The composites provide for a deformable and elastic composite which maintains semiconductor operations under stress, and can be used for filtering, determining compressive force, and a variety of other applications.

14 Claims, 7 Drawing Sheets
(6 of 7 Drawing Sheet(s) Filed in Color)

(56) References Cited

U.S. PATENT DOCUMENTS

| | | | |
|---|---|---|---|
| 2006/0204724 A1* | 9/2006 | Argoitia | B05D 3/12 |
| | | | 428/172 |
| 2009/0256131 A1 | 10/2009 | Schricker | |
| 2011/0244121 A1* | 10/2011 | Roberts | B05D 3/12 |
| | | | 427/180 |
| 2015/0053927 A1 | 2/2015 | Arnold et al. | |
| 2017/0052135 A1 | 2/2017 | Voiculescu et al. | |
| 2019/0006061 A1* | 1/2019 | Son | H01B 1/22 |

OTHER PUBLICATIONS

Karimov et al., "Fabrication of flexible conductive films by rubbing in technology for application in elastic thermo-electric cells", MethodsX 6 (2019) 424-427.

\* cited by examiner

FABRICATION OF FLEXIBLE CONDUCTIVE FILMS, WITH SEMICONDUCTIVE MATERIAL, FORMED WITH RUBBING-IN TECHNOLOGY FOR ELASTIC OR DEFORMABLE DEVICES

FIELD OF THE INVENTION

The invention pertains to elastic and deformable electronic devices produced with rubbing-in technology and, more particularly, to complex semiconductor devices and their method of fabrication.

BACKGROUND

There has been much interest in developing conductive films that can deform and stretch, while retaining their conductive properties. For example, Takakaluru *Sensors* (2014) 14:868-876 describes stretchable and flexible carbon nanotubes on natural rubber. These sensors are made by rubbing-in the carbon nanotubes into a surface of the rubber by hand. Karimov *MethodsX* (2019) describes a dramatically better process whereby carbon nanotubes together with other materials useful for thermoelectric cells such as copper phthalocyanine (CuPc), nickel phthalocyanine (NiPc), p-type bismuth telluride (p-Bi2Te3), poly(3,4-ethylenedioxythiophene)-poly(styrenesulfonate) PEDOT:PSS, and silver paste, are rubbed-in under load to the surface of a rubber material. The rubbing-in methodology has significant advantages over other technologies such as, for example, U.S. Patent Publication 2017/0052135 to Voiculescu wherein carbon nanotubes are stamped as a pattern conductive electrode onto a pre-stretched silicone layer, and U.S. Patent Publication 2003/0092207 to Yanniv where a carbon nanotube mixture is deposited onto substrate. Such prior technologies suffer from having a surface coating, rather than a composite like structure where the conductive material is embedded in the surface of the substrate.

There is a growing need to provide different and more complex elastic and deformable devices.

SUMMARY

It is one aspect of this invention to provide a deformable, semiconductive, composite, which includes a rubber substrate that has an undoped region, a region that has been doped with a conductive material such as carbon nanotubes, and a second region that has been doped with both conductive and semiconductive material such as carbon nanotubes and polycrystalline silicon, where the substrate is a film that can be compressed, stretched, and/or deformed with negligible deterioration in electrical performance.

It is yet another aspect of this invention to provide a deformable, semiconductive, composite which is made using rubbing-in technology, and which permits the formation of regions in a rubber substrate that include inorganic semiconductor material, and other regions in a rubber substrate which include conductive material.

According to the invention, a stretchable rubber material serves as a substrate for the formation of a conductive film with patterns of semiconductive material therein. The top and/or bottom surface is embedded with a conductive material using a rubbing-in technology. The region with the embedded conductive material is then patterned, and the patterned region is embedded with a semiconductive material, again using a rubbing-in technology. The films created can be used in a variety of applications including, without limitation, use as compressive displacement sensors, use for the demodulation of the frequency-modulated signals, and use in shake proof equipment (e.g. shake proof washers, shake proof square cone washers, lynch pin). Furthermore, the processing used is inexpensive, results in reliable electronic performance under strained and deformed conditions, and the same substrate may be patterned on opposite sides with the same or different electrical patterns.

DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION

Figure 1A:
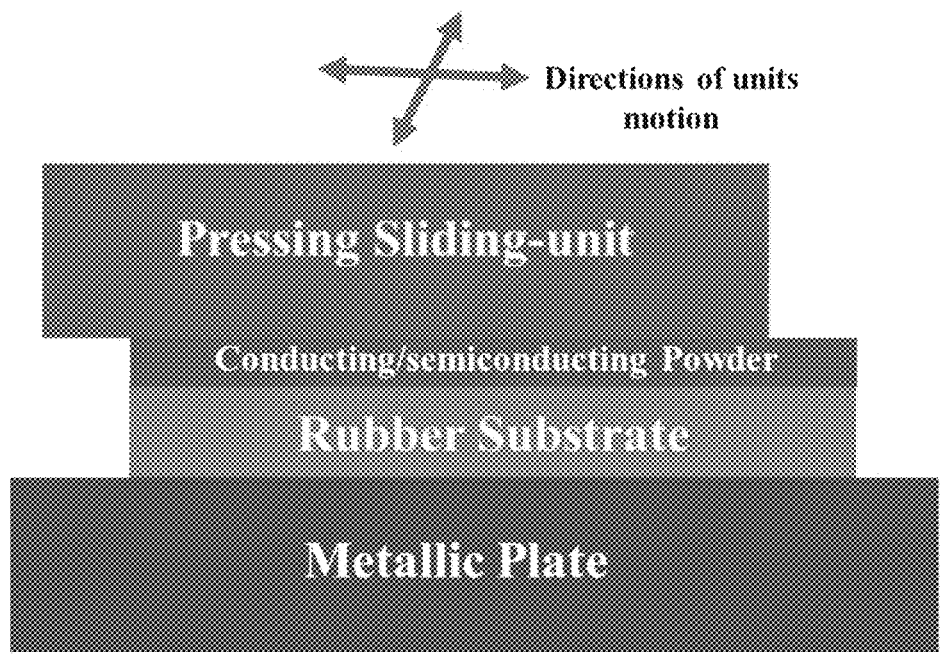
FIG. 1A is a schematic drawing illustrating the rubbing-in technology to form rubber-nanomaterials composite conductive/semiconductive films.

FIG. 1A illustrates the rubbing-in technology used to manufacture composites according to the invention. In a preferred embodiment, a polished metallic surface which holds the rubber substrate in extended (stretched) position. The base surface can be a metallic plate, but could also be any other material that can securely hold the rubber substrate and can withstand rubbing operations such as plastic, ceramic, glass, and wood. The rubber substrate which will be used to make the composites of the invention can be any kind of stretchable rubber including silicone, styrene-butadiene rubber, natural rubber, butyl rubber, nitrile rubber, neoprene rubber, ethylene, and viton. In some applications, a hard rubber, such as styrene-butadiene is preferred. Once the composite is created, the composite is intended to be stretchable, compressible, and deformable. Depending on the needs of the fabricator, this may affect the choice of material for the rubber substrate and the thickness of the material. In exemplary embodiments, the substrate may be 5-1000 µm thick; however, the rubber substrate may be thicker or thinner depending on the application. In addition, for good embedding of the conductive material and semiconductive material in the surface of the rubber substrate, the rubber substrate should be stretchable, for example, stretchable by, for example, 5-100% its length and width. In most applications, the rubber substrate will be stretched (put under strain) such that increases its length and/or width by 10-30%.

In the rubbing-in technology, the conducting powder or conducting/semiconducting powder placed on a surface of the rubber substrate is rubbed into the surface of the substrate using a pressing/sliding unit that applies a downward force or load against the surface of the rubber substrate, and which moves in any of multiple directions across the surface of the rubber substrate while applying the downward force. FIG. 1A shows arrows going in the lengthwise direction and widthwise direction of the rubber substrate; however, the pressing sliding unit can move in any direction, including circularly, etc. The goal of the rubbing-in operation is to cause the conductive powder and/or conducting/semiconducting powder to penetrate into the enlarged pores of the rubber. Pre-stretching of the rubber substrate prior to rubbing-in the conductive powder or conductive/semiconducting powder enlarges the pores of the rubber and makes the surface more receptive to embedding the conductive material and semiconductive material. The rubbing-in operation forms a composite layer with the rubber which can be used for device fabrication of a wide variety of devices, and particularly semiconductive devices according to the present invention. The rubber-conducting/semiconducting powder composite layer can be formed on both surfaces of the rubber substrate simply by, for example, turning it over and repeating the rubbing-in operations.

Figure 1B:
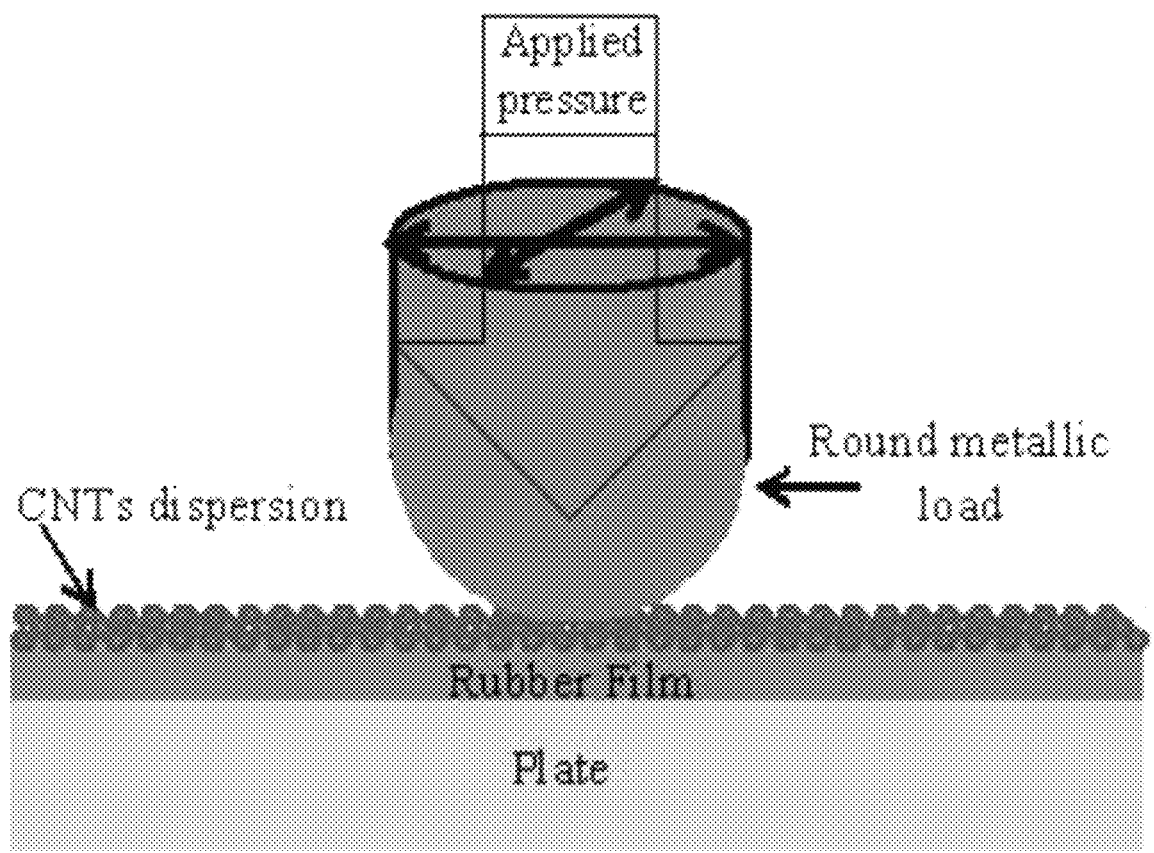
FIG. 1B is a schematic drawing of rubbing-in technology which can be used within the practice of the invention.

FIG. 1B illustrates an exemplary rubbing-in technology where a rounded metallic load is used for rubbing-in the conductive powder or conductive/semiconducting powder. The load may vary considerably depending on the rubber substrate, the conductive powder, the semiconductive powder, and other factors and may range from 1 gf/cm$^2$ to 100 gf/cm$^2$ (preferably ranging from 10 to 75 gf/cm$^2$). For the samples described and tested herein the load for different rubbing-in processes ranged from 10 gf/cm$^2$ to 20 gf/cm$^2$. While FIG. 1B depicts a metallic load, the load may be any other hardened materials such as plastics and ceramics. The rounded shape allows the load to move easily in any direction. The rubbing-in will typically be performed under computer control, and rubbing can take place over the entire surface of the rubber substrate as shown in FIG. 1B or only in selected regions of the substrate.

The conductive powder rubbed into the surface of the rubber can be any of a variety of materials including carbon nanotubes (CNT), graphene, and carbon powder. CNTs, as are shown in FIG. 1B are particularly preferred. Good results can be achieved with CNTs having a mean diameter of 5 to 50 nm and a mean length of 75 to 250 nm.

The semiconductive powder rubbed into the surface of the rubber can be any of a variety of materials including an inorganic semiconductor such as polycrystalline silicon (p-Si), germanium (Ge), and gallium arsenide. Good results can be achieved with p-Si in particulate form with particles having a mean particle size of 7.5 to 15 µm.

Figure 2:
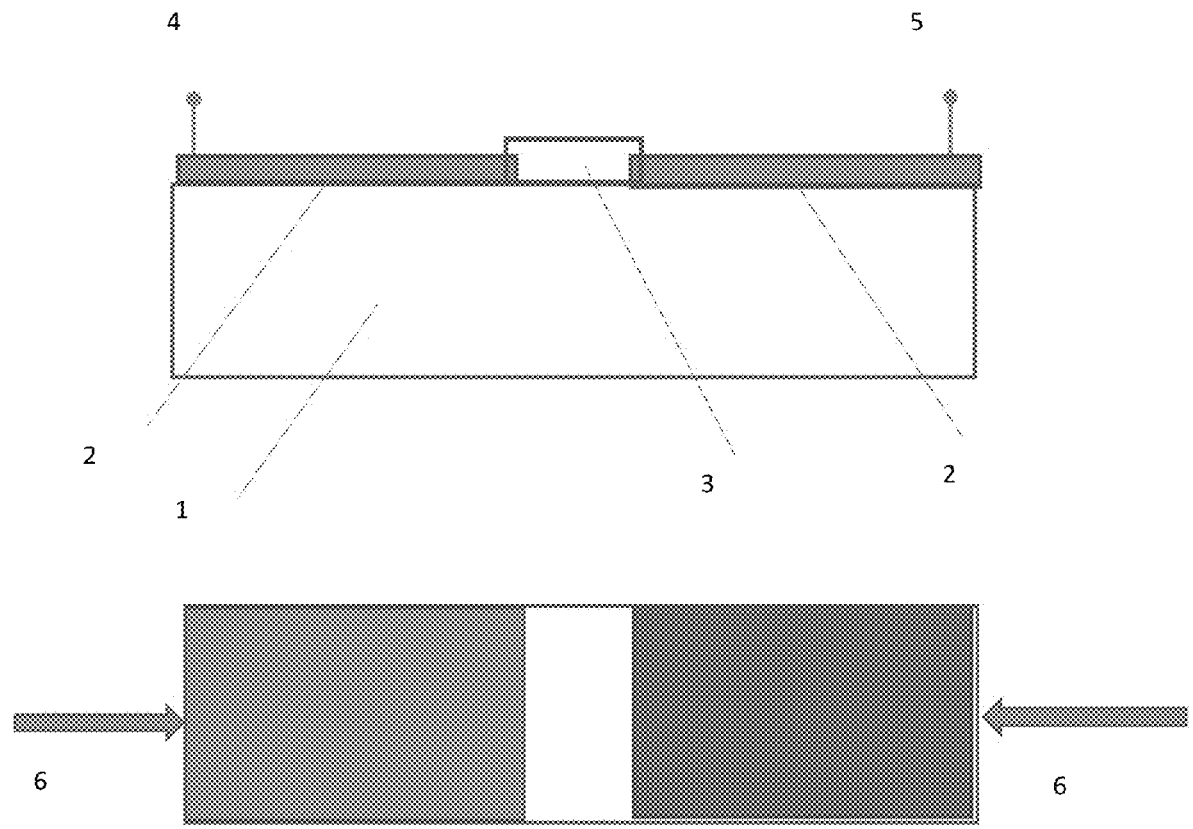
FIG. 2 are schematic diagrams respectively illustrating a side view and top view of a sample showing a rubber substrate having a top surface doped with electrically conductive carbon nanotubes (CNT), and a patterned region doped with both electrically conductive carbon nanotubes (CNT) and semiconductive polycrystalline silicon (p-Si). The exemplary device illustrated in FIG. 2 was used for the investigations of impedimetric (impedance) properties of built-in rubber CNT and p-Si based deformable composite described herein.

FIG. 2 shows an example of a patterned composite according to the invention, and particularly, a CNT and p-Si based deformable composite. The deformable rubber substrate 1 includes CNT embedded in the rubber 2 at the top surface. Centrally, the deformable rubber substrate 1 includes both CNT and p-Si embedded in the rubber 3 at the top surface. Terminals 4 and 5 can be connected to the device. While FIG. 2 shows a single region with semiconductor material therein, it should be understood that many different regions can be patterned to include the semiconductor material, e.g., a plurality of stripes between the terminals 4 and 5, a plurality of separated cylinders, etc. The patterning with semiconductor material will vary depending on the needs of the fabricator. FIG. 2 also shows, as an example, compressive forces 6 being exerted on the ends of the patterned composite. This might occur in the case of the composite of the invention being used in, for example, a compressive displacement sensor. However, it should also be recognized that the composite is designed to be stretched, deformed (e.g., twisted, bent over other devices), etc., without appreciable degradation in electrical performance.

The patterned composite of FIG. 2 can be made by first rubbing-in a conductive powder (e.g., CNTs having a mean diameter of 5 to 50 nm and a mean length of 75 to 250 nm) over all or a part of a surface of a rubber substrate while the rubber substrate is under stress (i.e., stretched). Then, one or more portions of the region embedded with the conductive powder are removed to expose one or more portions of bare rubber. In FIG. 2, this can be accomplished by cutting away, or otherwise excising the embedded CNT powder and rubber in a central stripe across the surface of the rubber substrate. However, as discussed above, the pattern can vary considerably depending on the needs of the fabricator, and one or a plurality of portions of the embedded region at the surface of the rubber can be removed so as to expose one or more regions of the rubber substrate where the one or more portions were removed. Then, a powder of semiconductive material and conductive material and be rubbed into the surface of the rubber substrate at the exposed region. Preferably, the powder will have CNTs having a mean diameter of 5 to 50 nm and a mean length of 75 to 250 nm and p-Si in particulate form with particles having a mean particle size of 7.5 to 15 µm. The mixture of conductive material and semiconductive material assures that the semiconductor operates well with the doped conductive regions of the rubber substrate. Removal of the portions of the conductive material rubbed into the surface of the rubber substrate prior to rubbing in the inorganic semiconductor and conductive material, assures that the inorganic semiconductor is embedded in the surface of the rubber. The rubbing-in can be performed under the same or different conditions as was used for rubbing-in the conductive material.

To demonstrate the utility of the invention a plurality of samples similar to those shown in FIG. 2 were constructed and tested under various conditions, and compared to, in some instances, the performance of p-Si.

The deformable composite samples based on CNT and p-Si built-in rubber were fabricated using rubbing-in technology. The effect of humidity up to 90% RH, temperature up to 60° C. and frequency of applied voltage in the interval of 1-200 kHz on the impedance of the samples were investigated A p-Si wafer and CNTs (carbon nanotubes) powder were purchased from Sun Nanotek Co. LTD. The diameter of the multiwalled carbon nanotubes was 10 to 30 nm, while their length was in the range of 100 to 200 nm. The silicon power was prepared from by grinding the p-Si crystalline wafer with following specification: sizes 6-inch (15.6 cm×15.6 cm), p-type (Boron doped), thickness: 180 µm, resistivity: 1.8 ohm/cm, doping concentration: $8e^{15}$, textured both sides (random pyramid) and crystal orientation: <100>. The particle size of the p-Si powder was mostly in the range of 9 µm to 12 µm.

Rubbing-in technology as described above was used to fabricate the rubber-CNT and rubber-CNT-p-Si conductive films. A polished metallic surface which holds the rubber substrate in an extended (stretched) position was prepared. To form the composite the conducting/semiconducting powder is poured on to the stretched rubber substrate. A round shaped polished metallic block is used to rub the powder on the rubber surface using a special mechanism which controls the frequency and direction of the block. By this process the powder penetrates into the enlarged pores of the rubber and form a composite layer with rubber, which can be used for device fabrication. The rubber-conducting/semiconducting power composite layer can be formed on both surfaces of the rubber substrate.

Samples of various dimensions (length: 2 cm to 3 cm, width: 1.5 cm to 2 cm, thickness: 1 mm to 2 mm can be prepared on the fabricated set-up. The samples are strained normally about 15 to 20%. Depending upon the sample's requirements, a range of loads (10 gf/cm² to 20 gf/cm²) may be applied using various rubbing blocks. The frequency of the rubbing blocks varies from 10 to 20 Hz. The duration of the sample preparation was 15-20 s on average.

Exemplary deformable composite samples based on CNT and p-Si built-in rubber were fabricated. A 2 cm×3 cm rubber sheet of thickness of 1-2 mm was stretched up to 15-20% in two directions: length and width of the sample. While holding the sample in the strained position, carbon nanotubes (CNTs) powder was applied using the above-mentioned rubbing-in technology. The depth of the formed rubber-CNTs composite layer was 8-12 µm.

In the middle of the sample, a gap of 2 cm in length and 0.5 cm in width was made by removing rubber-CNT layer down to the pure rubber surface. This gap was filled by the mixture of CNT-p-Si powders (50/50 wt. %) (this ratio can be varied considerably, e.g., from 80/20 wt % to 20/80 wt %). To incorporate the CNT-p-Si mixture in the rubber substrate, the same procedure (rubbing-in) was applied. All samples were fabricated at pressure of 40 g/cm². Figure shows the schematic diagram of fabricated sample. In the prepared samples the rubber-CNTs-p-Si composite played the role of the sensitive material.

A digital multi-meter DT-4253-Hioki was used for the measurement of current and voltages (I-V) characteristics. All experiments were conducted at room temperature conditions. The uniaxial compressive displacements or pressure were applied along the length of the rectangular prism sample by use of the micrometer mechanism or weights in special experimental arrangement. Processes of application of compressive forces on the rubber sample are shown in FIG. 2.

Figure 3:
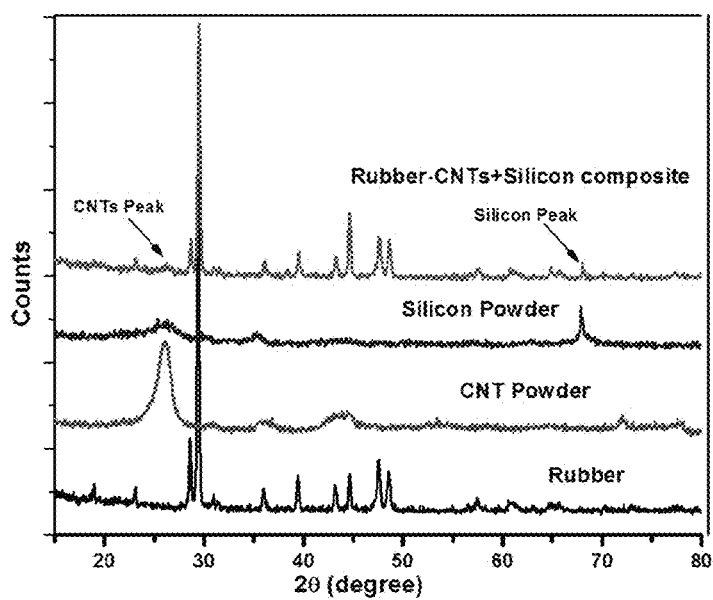
FIG. 3 are X-ray diffraction patterns of original rubber, CNTs powder, silicon powder and rubber-CNTs+silicon composite.

X-ray diffraction of the samples were conducted with Philips PW1830 X-ray diffraction system in Bragg-Brentano (θ-2θ) scan mode using Cu-Kα radiation source at room temperature. Each sample was run three times and found repeatable results. The X-ray diffractograms of original rubber, CNTs powder, silicon powder, and rubber-CNTs+ silicon composite, are presented in FIG. 3.

The XRD pattern of rubber shows notable high intensity Bragg's diffraction peaks at 2θ of 23.1°, 29.4° and 36°, respectively. These peaks and other peaks present in the rubber X-ray diffraction pattern are characteristics of polyvinyl chloride which correspond to high amount of structural arrangement (order) in its polymeric chain. In CNTs powder diffractogram, the broad and major peak of CNTs was observed around 26.2° (002) which is attributed to the hexagonal graphite structure, having high electrical conductivities. This peak is consistent with standard x-ray diffraction data (ICSD code: 031170). One additional peak is also observed at 38.4° as a result of a different functional group attached to the CNTs. A broad peak of CNTs consistent with other studies (see Lu *Scientific Reports* 5, 16584 (2015) 10.1038/srep16584) was also observed at 2θ of 44.3° (101). A sharp peak of p-type silicon powder was observed at 2θ=68.9°. In rubber-CNTs+silicon composite diffractogram, the additional peak of CNTs and silicon powder was observed around 2θ of 26.2° and 68.9°.

Figure 4:
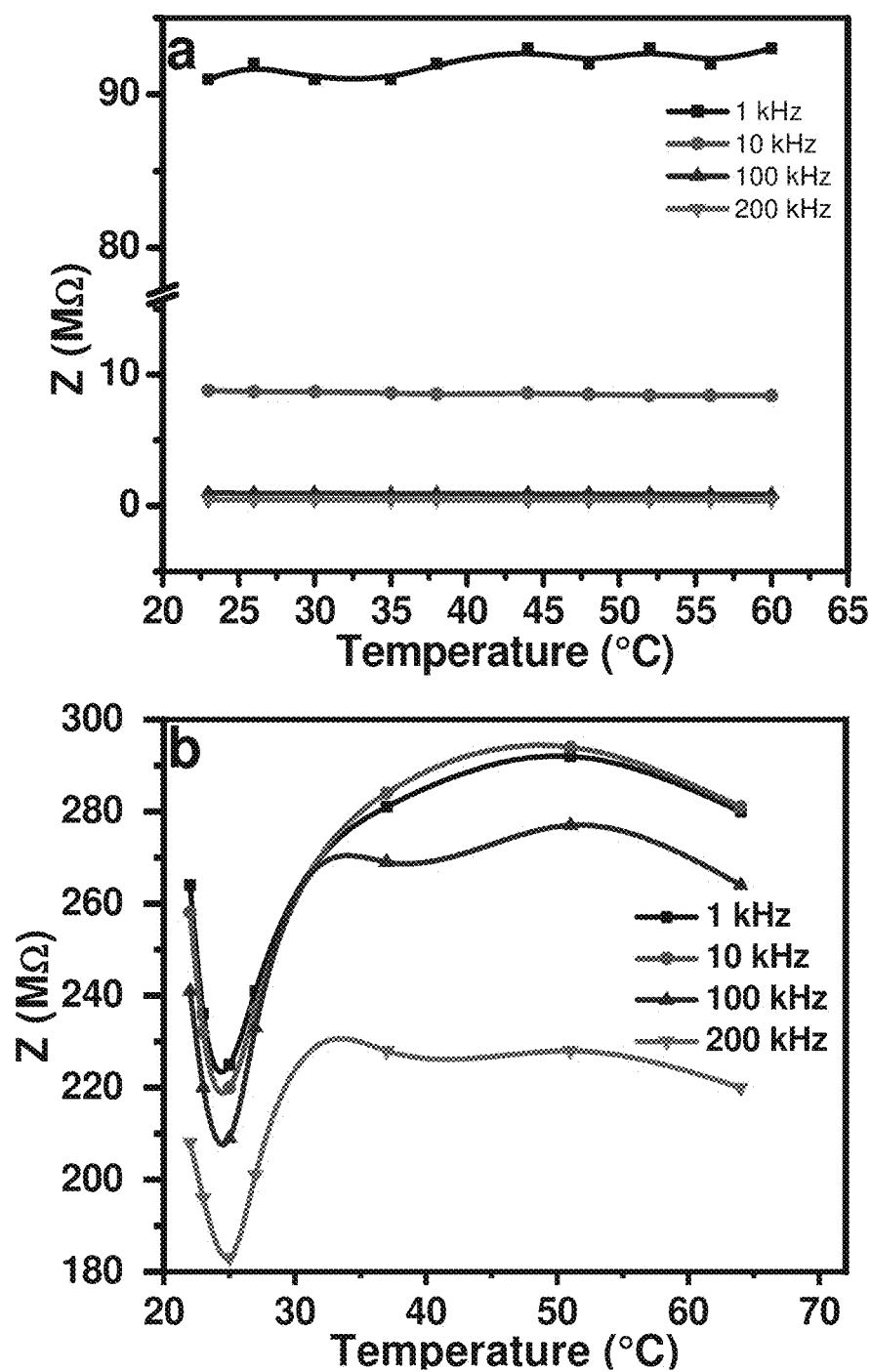
FIG. 4 are graphs respectively showing a comparison of the dependencies of the impedances of the CNT-p-Si-rubber composite according to the present invention (top graph) and p-Si crystal (bottom graph) on temperature at different frequencies.

FIG. 4, in the top graph, shows the dependences of the impedances of the CNT-p-Si-rubber composite sample at different frequencies on the temperature. From the top graph of FIG. 4, it is seen that, from a practical perspective, impedances of the sample at 1 kHz, 10 kHz, 100 kHz and 200 kHz don't depend on temperature.

FIG. 4 in the bottom graph, shows dependences of the impedances of the p-Si crystal sample at different frequencies on the temperature. It is seen that with the impedances a few decrease with increases in temperature and after that the impedances increase with increases in temperature. It was calculated that on average the impedances due to increases of the temperature from 22° C. to 64° C. increased 8% only in the case of p-Si crystal sample.

Comparison of the results in the top and bottom graphs of FIG. 4 demonstrates that unlike the case of p-silicon crystal, formation of a CNT, p-Si and rubber composite according to the invention allows for fabrication of electronic material which can be potentially used for making of the resistors and other devices.

Figure 5:
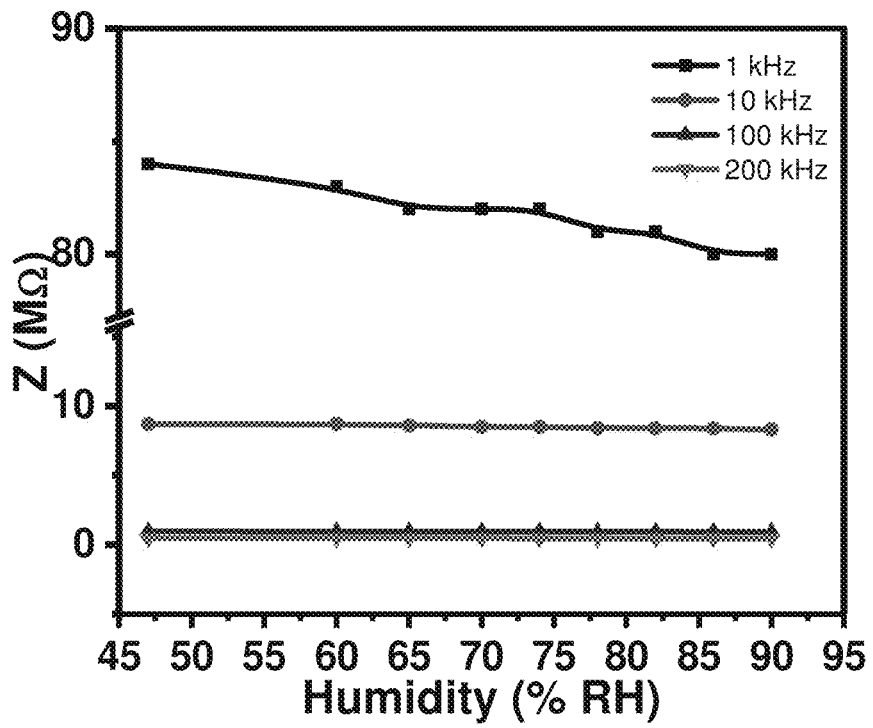
FIG. 5 is a graph showing the dependences of the impedances of the CNT-p-Si-rubber composite sample according to the present invention on humidity at different frequencies.

FIG. 5 shows the dependences of the impedances of the CNT-p-Si-rubber composite sample at different frequencies based on the humidity. It was found that with an increase of the humidity from 47% to 90%, the impedances decreased on average only on 5%.

Figure 6:
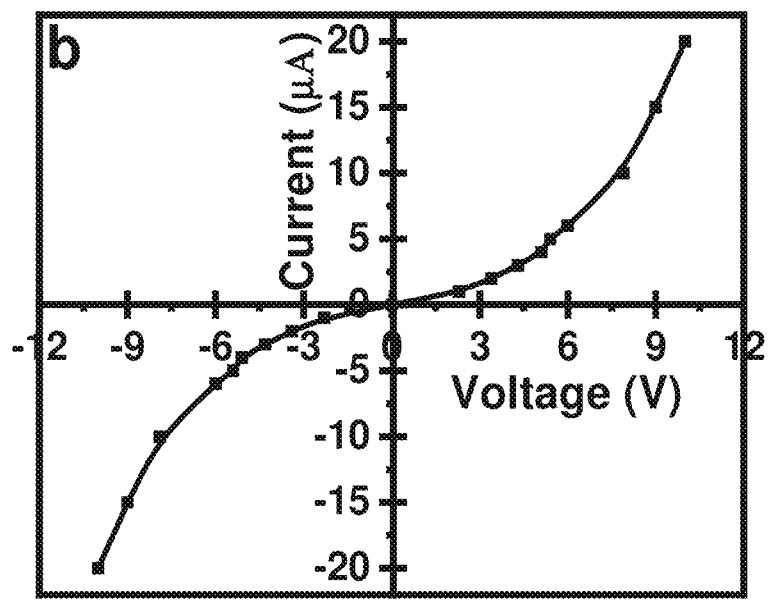
FIG. 6 are graphs respectively showing impedance-voltage (I-V) characteristics of the CNT-p-Si-rubber composite of the present invention (top graph) and p-Si crystal (bottom graph) at room temperature conditions.
Figure 6:
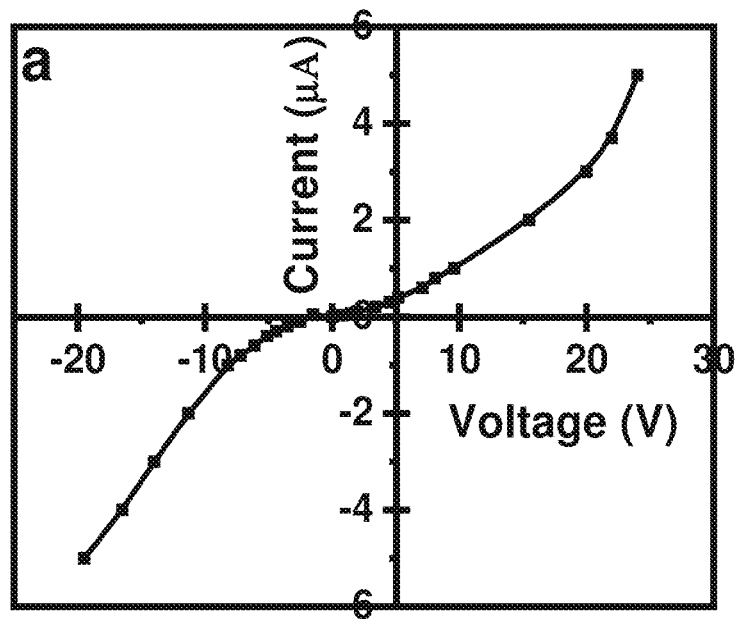

FIG. 6, in the top graph, shows I-V characteristics of the CNT-p-Si-rubber composite sample at room temperature conditions. FIG. 6 in the bottom graph shows I-V characteristics of the p-Si crystal sample. It can be seen that I-V characteristics of CNT-p-Si-rubber composite sample and p-Si crystal sample are non-linear.

The non-linearity coefficient (a) can be calculated by the following expression (see Khan *World Applied Sciences Journal* (2016) 24:1261-1268):

$$\alpha = (\log(I_2/I_1)/\log(V_2/V_1)) \quad (1)$$

It can be determined also by the following expression $$\beta = dIV_o/I_o dV \quad (2)$$

Figure 7:
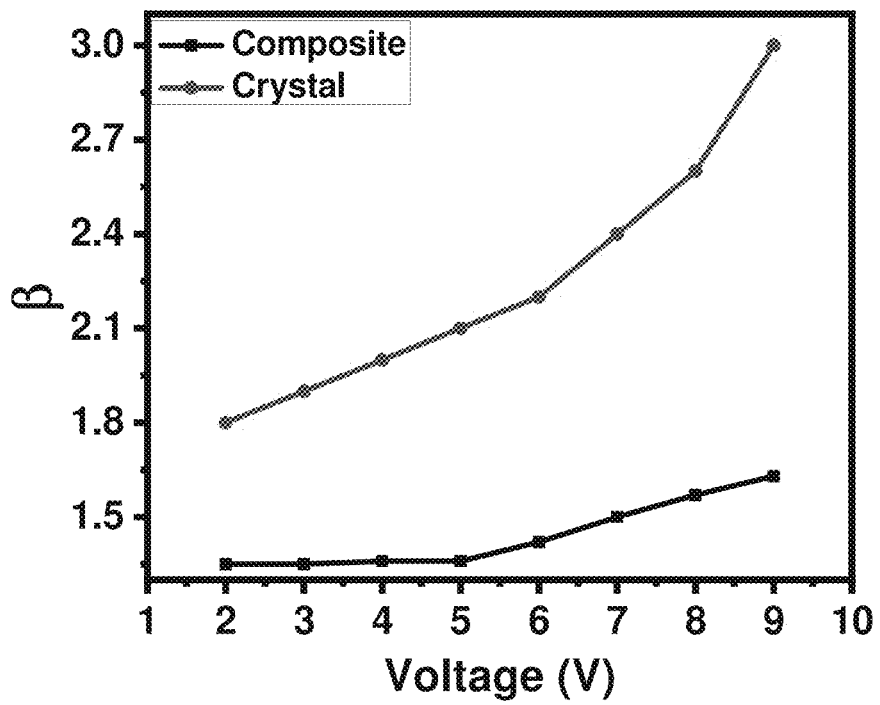
FIG. 7 is graph showing a comparison of the $\beta$ (V) relationships for a CNT-p-Si-rubber composite of the present invention and p-Si crystal.

FIG. 7 shows β (V) relationships accordingly for the CNT-p-Si-rubber composite sample and the p-Si crystal sample. It is seen that CNT-p-Si-rubber composite sample has a non-linearity coefficient (β) that is in the range of (1.35-1.63) and is lower than of Si crystal sample by approximately 1.5 times. It can be considered that non-linearity of the I-V characteristics are, firstly, due to decrease of the resistance of the sample on heating by current passing through the sample and, secondly, due to the composition of the samples.

Figure 8:
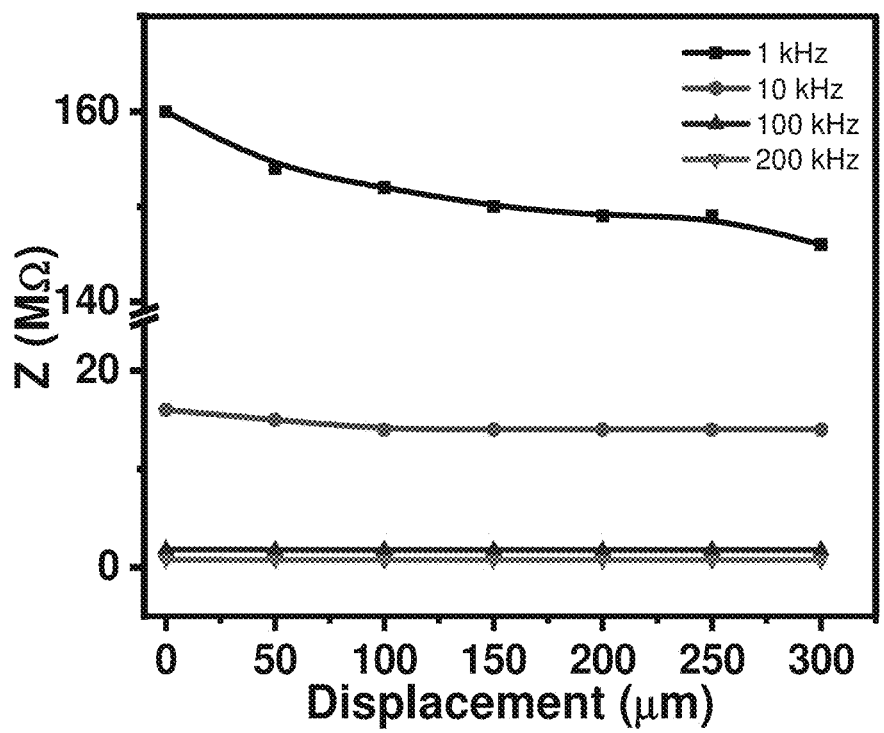
FIG. 8 is a graph showing the effect of the compressive displacement to the resistance of a CNT-p-Si-rubber composite according to the invention.

The effect of the compressive displacement to the resistance was determined (See FIG. 8). Resistance decreased 1.26 times at increases of the displacement up to 100 μm.

Figure 9:
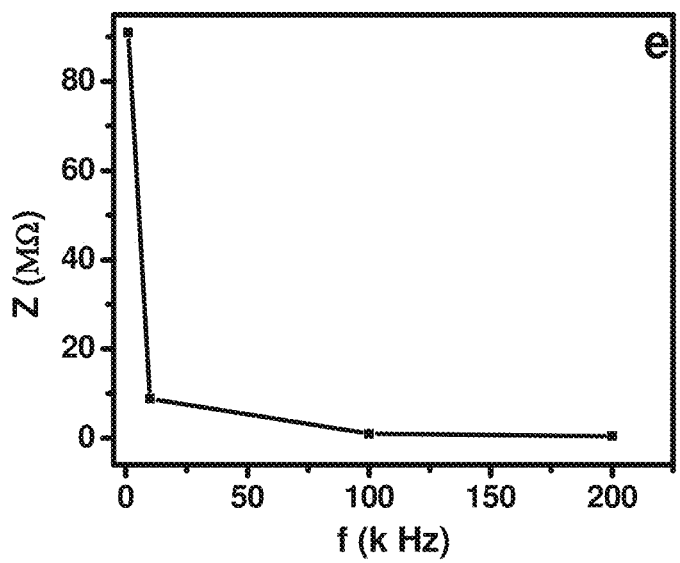
FIG. 9 is a graph showing impedance-frequency relationship of CNT-p-Si-rubber composite according to the invention at temperature of 23° C.

Sensitivity (S) of the displacement sensor can be found by the following expression:

$$S = dZ100\%/ZdD \quad (3)$$

where Z is impedance and D is displacement. It was found that S=0.03%/μm at frequency of 1 kHz. The deformable composite can be used for fabrication of displacement sensor or flexible resistor and impedance. FIG. 9 shows frequency dependences of the impedances at temperature of 23° C. The impedances are very much dependent of frequencies, and these are like the properties of the electronic filters (see Khan, ibid).

Figure 10:
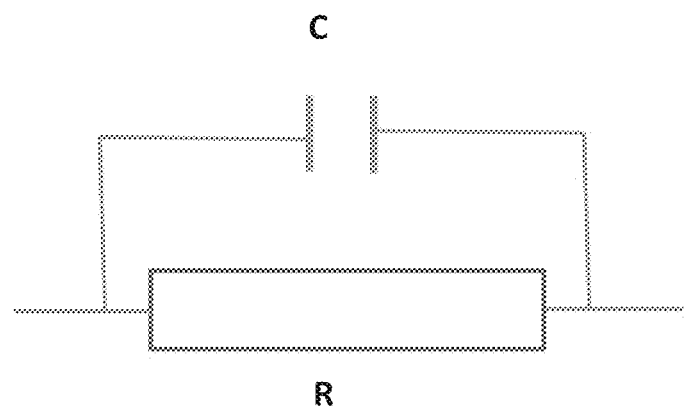
FIG. 10 is a graph showing an exemplary schematic diagraph of an equivalent circuit of the CNT-p-Si-rubber composite according to the invention.

By use of this composite sample in electronic circuits, in principle, it is possible to fabricate low or high pass filters. The impedance of the sample can be represented as parallel connection of the resistor and capacitor (FIG. 10), the contribution of the capacitance to the impedance is much with respect of resistance. The impedance (Z) of the circuit shown in FIG. 10 and is defined as:

$$Z = R/(1+j\omega RC) \quad (4)$$

In summary, rubbing-in technology was used to fabricate the rubber-CNT-p-Si nanocomposite-based flexible conductive films. The effect of humidity up to 90%, temperature up to 60° C., frequency of applied voltage in the interval of (1-200) kHz, on the impedance of the samples were investigated. It was also revealed that the impedance of the rubber-CNTs-p-Si composite at 1 kHz was practically independent of temperature. At 10 kHz, 100 kHz and 200 kHz impedances of the composites decreased up to 9% when temperature increased from 23° C. up to 60 C. The temperature dependences of impedances of the p-Si crystal strips in average increased on 8-9% with the increase of the temperature and showed minimum at 25° C. As relative humidity was changed in the interval of (47-90) % the impedances of the composites decreased in the average on 5% of the values. On increasing displacement (compressive) up to 300 μm the impedance decreases from 4% to 9% depending on the frequencies: at lower frequencies the changes were higher than in higher frequencies. The impedances of the sample decreased sharply with increase of the frequency that potentially can be used for fabrication of the filters. The I-V characteristics of the CNT and p-Si composite samples and p-Si crystal samples as well were non-linear. The non-linearity coefficients of the I-V characteristics were equal to 3.1 and 2.5 for composite and p-Si crystal samples accordingly. The elastic composite based on rubber, CNT and p-Si can be used as a compressive displacement sensor and for the demodulation of the frequency-modulated signals. Testing showed the semiconductive composite had a current-voltage nonlinearity coefficient beta of 1.25 to 1.75, an impedance of 90 to 150 MΩ/cm at 30 to 70° C. at 1 kHz, and an impedance at 1 kHz which decreases by 0.03% per μm of compressive displacement compared to an uncompressed impedance at 1 kHz.

The invention claimed is:

1. A method for preparing a deformable, semiconductive, composite, comprising:
    stretching a rubber substrate;
    applying a first powder of a first conductive material to a surface of the substrate while the rubber substrate is stretched;
    rubbing the first powder of the conductive material into the surface of the substrate using a loading device which applies pressure on the first powder against the surface and which moves in a plurality of directions across the surface, wherein rubbing produces an embedded region of the conductive material in the surface of the rubber substrate, wherein rubbing the first powder is performed while the rubber substrate is stretched;
    removing one or more portions of the embedded region so as to remove the conductive material in the one or more portions and associated rubber in the one or more portions of the embedded region so as to expose one or more regions of the rubber substrate where the one or more portions were removed;
    applying a second powder comprising a second conductive material and a semiconductive material in the one or more regions of the rubber substrate where the one or more portions were removed while the rubber substrate is stretched;
    rubbing the second powder into the one or more regions of the rubber substrate where the one or more portions were removed using the loading device which applies pressure on the second powder against the surface and which moves in a plurality of directions across the surface, wherein rubbing the second powder is performed while the rubber substrate is stretched; and
    relaxing the stretch on the rubber substrate to produce the deformable, semiconductive, composite, wherein the deformable, semiconductive composite, comprises a first portion which is rubber which is not doped with the first conductive material, the second conductive material, or the semiconductive material, a second portion which comprises rubber doped with the first conductive material, and one or more third portions which comprises rubber doped with the second conductive material and the semiconductive material.

2. The method of claim 1 wherein the first conductive material and the second conductive material are the same and are carbon nanotubes.

3. The method of claim 2 wherein the semiconductive material is polycrystalline silicon.

4. The method of claim 3 wherein the carbon nanotubes have a mean diameter of 5 to 50 nm and a mean length of 75 to 250 nm.

5. The method of claim 3 wherein the polycrystalline silicon is in particulate form with particles having a mean particle size of 7.5 to 15 μm.

6. The method of claim 3 wherein the carbon nanotubes are 20 to 80% by weight and the polycrystalline silicon is 80 to 20% by weight of the second powder.

7. The method of claim 6 wherein each of the carbon nanotubes and polycrystalline silicon are present in the second powder at approximately 50% by weight.

8. The method of claim 3 wherein the two rubbing steps embed the carbon nanotubes and polycrystalline silicon to a depth of 5 to 20 μm in the surface of the rubber substrate.

9. The method of claim 1 wherein the first and second rubbing procedures are independently performed using a rubbing pressure of 5 to 75 gf/cm2.

10. The method of claim 9 where in the first and second rubbing steps are independent performed at 5 to 50 Hz for 5 to 30 seconds.

11. The method of claim 1 wherein the rubber substrate is a styrene-butadiene rubber.

12. The method of claim 1 wherein the semiconductive material is an inorganic semiconductor.

13. The method of claim 12 wherein the inorganic semiconductor is polycrystalline silicon.

14. The method of claim 1 further comprising the step of repeating the each of the steps on a second surface of the rubber substrate.

* * * * *